(12) United States Patent
Brand

(10) Patent No.: US 7,067,905 B2
(45) Date of Patent: Jun. 27, 2006

(54) PACKAGED MICROELECTRONIC DEVICES INCLUDING FIRST AND SECOND CASINGS

(75) Inventor: Joseph M. Brand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 10/215,509

(22) Filed: Aug. 8, 2002

(65) Prior Publication Data

US 2004/0026776 A1   Feb. 12, 2004

(51) Int. Cl.
*H01L 23/495* (2006.01)
*H01L 21/48* (2006.01)
*H05K 7/20* (2006.01)

(52) U.S. Cl. .................. 257/675; 257/707; 257/713; 257/720; 257/787; 257/796; 438/122; 438/123; 438/127; 361/704; 361/709; 361/710; 361/722

(58) Field of Classification Search ................ 257/717, 257/675, 707, 712, 713, 720, 730, 787, 788, 257/790, 796, 706; 361/688, 704, 707, 709, 361/710, 714, 722; 438/106, 110, 111, 112, 438/121–127
See application file for complete search history.

(56) References Cited

U.S. PATENT DOCUMENTS

| | | | | |
|---|---|---|---|---|
| 5,057,457 A | * | 10/1991 | Miyahara et al. | 264/272.14 |
| 5,343,074 A | * | 8/1994 | Higgins, III et al. | 257/668 |
| 5,394,010 A | * | 2/1995 | Tazawa et al. | 257/686 |
| 5,406,117 A | * | 4/1995 | Dlugokecki et al. | 257/659 |
| 5,430,331 A | * | 7/1995 | Hamzehdoost et al. | 257/796 |
| 5,593,927 A | | 1/1997 | Farnworth et al. | |
| 5,677,566 A | | 10/1997 | King et al. | |
| 5,696,033 A | | 12/1997 | Kinsman | |

(Continued)

FOREIGN PATENT DOCUMENTS

| | | | | |
|---|---|---|---|---|
| JP | 63141353 A | * | 6/1988 |
| JP | 01220465 A | * | 9/1989 |
| JP | 04092459 A | * | 3/1992 |
| KR | 2001008825 A | * | 2/2001 |

*Primary Examiner*—Alonzo Chambliss
(74) *Attorney, Agent, or Firm*—Perkins Coie LLP

(57) ABSTRACT

The present invention is directed toward methods and apparatuses for encapsulating a microelectronic die or another type of microelectronic device. One aspect of the present invention is directed toward packaging a microelectronic die that is attached to either a first surface or a second surface of a substrate. The die can be encapsulated by positioning the die in a cavity of a substrate and sealing the substrate to the substrate. The method can further include injecting an encapsulation compound into the cavity at a first end of the substrate to move along the first surface of the substrate. This portion of the compound defines a first flow of compound along the first surface that moves in a first direction from a first end of the substrate toward a second end of the substrate. Several embodiments of the method also include driving a portion of the compound through the substrate at a pass-through location or a secondary gate that is spaced apart from the first end of the substrate to generate a second flow of compound along the second surface of the substrate. The second flow of compound moves in a second direction toward the first end of the substrate. As the first and second flows of compound move through the mold, the method includes inhibiting a third flow of compound from moving in the first direction along the second surface of the substrate between the first end of the substrate and the pass-through location.

23 Claims, 4 Drawing Sheets

U.S. PATENT DOCUMENTS

| | | | |
|---|---|---|---|
| 5,698,899 A * | 12/1997 | Hirakawa et al. | 257/712 |
| 5,739,585 A | 4/1998 | Akram et al. | |
| D394,844 S | 6/1998 | Farnworth et al. | |
| 5,804,468 A * | 9/1998 | Tsuji et al. | 438/122 |
| D402,638 S | 12/1998 | Farnworth et al. | |
| 5,851,845 A | 12/1998 | Wood et al. | |
| 5,879,965 A | 3/1999 | Jiang et al. | |
| 5,891,753 A | 4/1999 | Akram | |
| 5,893,726 A | 4/1999 | Farnworth et al. | |
| 5,898,224 A | 4/1999 | Akram | |
| 5,933,713 A | 8/1999 | Farnworth | |
| 5,938,956 A | 8/1999 | Hembree et al. | |
| 5,958,100 A | 9/1999 | Farnworth et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 6,008,070 A | 12/1999 | Farnworth | |
| 6,008,074 A * | 12/1999 | Brand | 438/126 |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,072,236 A | 6/2000 | Akram et al. | |
| 6,075,288 A | 6/2000 | Akram | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,133,068 A | 10/2000 | Kinsman | |
| 6,148,509 A | 11/2000 | Schoenfeld et al. | |
| 6,150,710 A | 11/2000 | Corisis | |
| 6,150,717 A | 11/2000 | Wood et al. | |
| 6,153,924 A | 11/2000 | Kinsman | |
| 6,159,764 A | 12/2000 | Kinsman et al. | |
| 6,172,419 B1 | 1/2001 | Kinsman | |
| 6,184,465 B1 | 2/2001 | Corisis | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,228,548 B1 | 5/2001 | King et al. | |
| 6,229,202 B1 | 5/2001 | Corisis | |
| 6,239,487 B1 * | 5/2001 | Park et al. | 257/712 |
| 6,246,108 B1 | 6/2001 | Corisis et al. | |
| 6,246,110 B1 | 6/2001 | Kinsman et al. | |
| 6,258,624 B1 | 7/2001 | Corisis | |
| 6,259,153 B1 | 7/2001 | Corisis | |
| 6,261,865 B1 | 7/2001 | Akram | |
| 6,277,671 B1 | 8/2001 | Tripard | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,297,547 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,705 B1 | 12/2001 | Ahmad | |
| 6,331,221 B1 | 12/2001 | Cobbley | |
| 6,331,448 B1 | 12/2001 | Ahmad | |
| 6,331,453 B1 | 12/2001 | Bolken et al. | |
| 6,332,766 B1 | 12/2001 | Thummel | |
| 6,344,976 B1 | 2/2002 | Schoenfeld et al. | |
| 6,355,985 B1 | 3/2002 | Brand | |
| 6,506,629 B1 * | 1/2003 | Kinsman et al. | 438/122 |
| 6,706,565 B1 * | 3/2004 | Brand | 438/126 |

* cited by examiner

PACKAGED MICROELECTRONIC DEVICES INCLUDING FIRST AND SECOND CASINGS

TECHNICAL FIELD

This invention relates to methods and apparatuses for packaging microelectronic devices; more particularly, this invention relates to encapsulating microelectronic dies in the manufacturing of memory devices, microprocessors and other types of microelectronic devices.

BACKGROUND OF THE INVENTION

Many packaged microelectronic devices have a substrate, a microelectronic die attached to the substrate, and a protective covering encasing the die. The protective covering is generally a plastic or ceramic compound that can be molded to form a casing over the die. The microelectronic die can be a memory device, a microprocessor, or another type of microelectronic assembly having integrated circuitry. Several types of packaged devices also include bond pads on the substrate that are coupled to the integrated circuitry of the die. The bond pads may alternatively be coupled to pins or other types of terminals that are exposed on the exterior of the microelectronic device for connecting the die to buses, circuits and/or other microelectronic assemblies.

A significant limiting factor for manufacturing packaged microelectronic devices is encapsulating the die with the protective covering. The dies are sensitive components that should be protected from physical contact and environmental conditions to avoid damaging the die. The protective casing encapsulating the die, therefore, should seal the die from the environmental factors (e.g., moisture) and shield the die from electrical and mechanical shocks.

One conventional technique for encapsulating the die is known as "transfer-molding," which involves placing the die and at least a portion of the substrate in a cavity of a mold and then injecting a thermosetting material into the cavity. The thermosetting material flows over the die on one side of the substrate until it fills the cavity, and then the thermosetting material is cured so that it hardens into a suitable protective casing for protecting the die. The protective casing should not have any voids over the die because contaminants from the molding process or environmental factors could damage the die. The thermosetting material, moreover, should not cover a ball-pad array on the substrate or damage any electrical connections between the die and the substrate. Therefore, it is important to control the flow of the thermosetting material in the cavity to avoid (a) producing voids in the protective casing over the die, (b) covering portions of the substrate with the thermosetting material that are not to be covered with the protective covering, and (c) displacing or otherwise damaging any wiring or solder joints between the die and the substrate.

One drawback of transfer-molding is that it is difficult to avoid producing voids in the thermosetting material. In one particular transfer-molding technique, a first protective casing is formed over the die on a first surface of the substrate, and a second protective casing is formed over contacts on the die and wire-bond connections on a second surface of the substrate. The first casing is formed from a first flow of the thermosetting compound, and the second casing is formed from a second flow of the thermosetting compound. This transfer-molding technique may result in voids along either the first or second surface of the substrate because the first and second flows may counter one another as they flow through the mold. Other transfer-molding techniques may also produce voids in the protective casing over the die because the flow of the thermosetting material in the mold may produce a first flow section that moves in a direction counter to a second flow section. Therefore, it would be desirable to eliminate voids in the protective casing.

SUMMARY OF THE INVENTION

The present invention is directed toward methods and apparatuses for encapsulating a microelectronic die or another type of microelectronic device. One aspect of the present invention is directed toward packaging a microelectronic die that is attached to either a first surface or a second surface of a substrate. The die can be encapsulated by positioning the die in a cavity of a mold and sealing the substrate to the mold. The method can further include injecting an encapsulation compound into the cavity at a first end of the substrate so that the compound moves along the first surface of the substrate. This portion of the compound defines a first flow of compound along the first surface that moves in a first direction from a first end of the mold toward a second end of the mold. The method can also include driving a portion of the compound through the substrate at a pass-through location or a secondary gate that is spaced apart from the first end of the substrate to generate a second flow of compound along the second surface of the substrate. The second flow of compound moves in a second direction toward the first end of the mold. As the first and second flows of compound move through the mold, the method includes inhibiting a third flow of compound from moving in the first direction along the second surface of the substrate between the first end of the substrate and the pass-through location.

Another aspect of this invention is a microelectronic device comprising a substrate, a microelectronic die attached to substrate, and a cover encasing at least a portion of the die. The substrate can have a first surface, a second surface, and plurality of ball-pads on the second surface. The microelectronic die can have a first side attached to the first surface of the substrate, a plurality of contacts on the first side, and an integrated circuit coupled to the contacts. The contacts of the die can be electrically coupled to the ball-pads of the substrate by a plurality of connectors. The cover can further include a first casing encapsulating the die and a portion of the first surface of the substrate, and a second casing encapsulating the contacts on the first side of the die and the connectors. The first casing has a first end, a second end, a first gate section at the first end, and a second gate section also at the first end. The first and second gate sections are spaced apart from one another along the first end.

DETAILED DESCRIPTION

The following disclosure is directed toward packaged microelectronic devices, and to methods for encapsulating a microelectronic die or another type of microelectronic device. Several embodiments of the invention are described with respect to memory devices, but the methods and apparatuses are also applicable to microprocessors and other types of devices. One skilled in the art will accordingly understand that the present invention may have additional embodiments, or that the invention may be practiced without several of the details described below.

Figure 1:
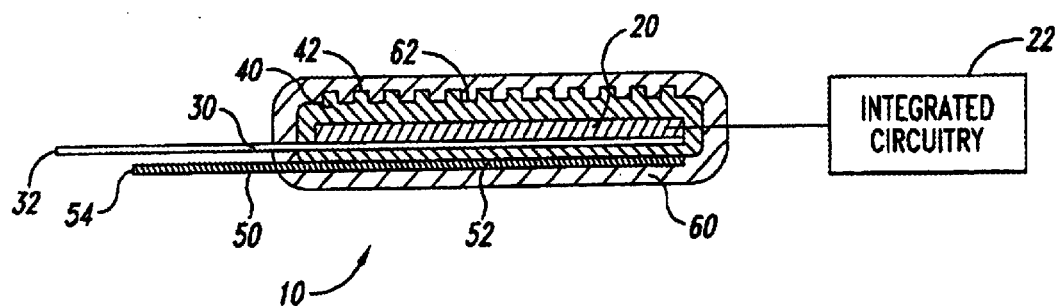
FIG. 1 is a top cutaway isometric view of a microelectronic device before being packaged in accordance with a method of one embodiment of the invention.

FIG. 1 is a top cutaway isometric view of a microelectronic device 10 that is to be encapsulated using a method in accordance with one embodiment of the invention. The microelectronic device 10 can include a substrate 20 and a microelectronic die 40 attached to the substrate 20 by an adhesive 60. The microelectronic device 10 shown in FIG. 1 illustrates the substrate 20 and the die 40 before encapsulating the die 40 with an encapsulation compound, such as a mold compound. The following description is directed toward encapsulating a microelectronic die on a flexible substrate, but it is expected that several embodiments of methods and molds in accordance with the present invention may be used to encapsulate a large variety of electrical and/or non-electrical articles. Therefore, the following description with respect to encapsulating the microelectronic die 10 shown in FIGS. 1–6 is for purposes of illustration only, and is not intended to limit the scope of the invention.

The embodiment of the substrate 20 shown in FIG. 1 can have a first end 21, a second end 22 opposite the first end 21, a first surface 23, and a second surface 24 opposite the first surface 23. The substrate 20 can also include an elongated slot 25 between the first and second surfaces 23 and 24 that extends lengthwise along a medial portion of the substrate 20. Additionally, an aperture 26 can extend through the substrate 20 at secondary gate location or a pass-through location that is generally proximate to the second end 22 of the substrate 20. The substrate 20 is generally an interposing device that provides an array of ball-pads for coupling very small contacts on the microelectronic die to another type of device. In the embodiment shown in FIG. 1, the substrate 20 includes a first array of ball-pads 27, a second array of terminal pads 28 proximate to the slot 25, and a trace 29 or other type of conductive line between each ball-pad 27 and corresponding terminal pad 28. The substrate 20 can be a flexible material or a substantially rigid material, and the traces 29 can be conductive lines that are printed on the substrate in a manner similar to printed circuit boards.

The embodiment of the microelectronic die 40 shown in FIG. 1 includes a first side 41 attached to the first surface 23 of the substrate 20 by the adhesive 60. The microelectronic die 40 can also include a plurality of small contacts 42 and an integrated circuit 44 (shown schematically) coupled to the contacts 42. The contacts 42 are arranged in an array along the first side 41 of the microelectronic die 40 so that the contacts 42 are aligned with or otherwise accessible through the slot 25 in the substrate 20. A plurality of wire-bonds or other types of connectors 50 couple the contacts 42 of the die 40 to corresponding terminal pads 28 on the substrate 20. As such, the substrate 20 distributes the very small contacts 42 to the larger array of ball-pads 27.

The adhesive 60 can be a two-sided tape or a decal adhered to the first surface 23 of the substrate 20 adjacent to the sides of the slot 25. In a typical application, the adhesive 60 creates a small gap 61 at the end of the slot 25 toward the first end 21 of the substrate 20. The gap 61 is defined by the distance between the first surface 23 of the substrate 20 and the first side 41 of the die 40, which is generally equal to the thickness of the adhesive 60. As explained in more detail below, the gap 61 can create several difficulties in encapsulating the terminal pads 28, the connectors 50, and the contacts 42.

Figure 2:
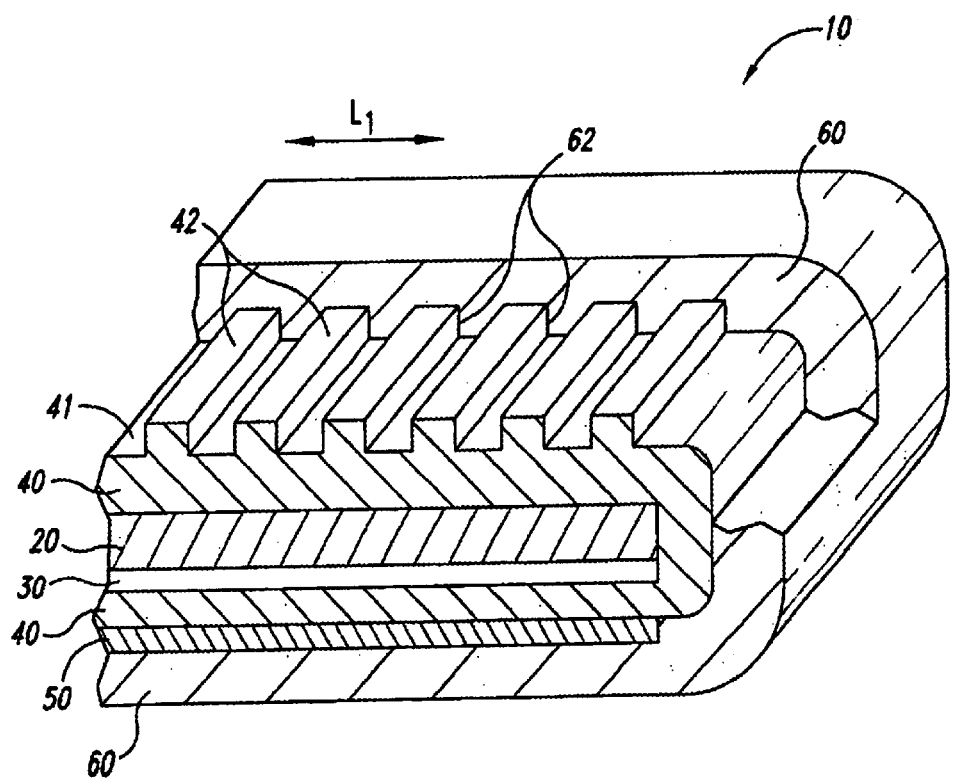
FIG. 2 is a side elevation view of the microelectronic device of FIG. 1.

FIG. 2 is a side elevation view of the microelectronic device 10 after the die 40 and a portion of the substrate 20 have been encapsulated by a mold compound 70. The mold compound 70 can be injected into a mold (not shown in FIG. 2) to form a first casing 72 that encapsulates the die 40 and a second casing 74 that fills the slot 25 (FIG. 1). The first casing 72 also covers a portion of the first surface 23 of the substrate 20, and the second casing 74 also covers the terminal pads 28 on the substrate 20 (FIG. 1), the connectors 50 (FIG. 1), and the contacts 42 on the die 40 (FIG. 1).

The first casing 72 can be formed by injecting the mold compound through a gate of a mold at the first end 21 of the substrate 20 so that the mold compound flows along the first surface 23 of the substrate 20 in a first direction (shown by arrows $A_1$–$A_3$). The second casing 74 is then formed by driving a portion of the mold compound through the aperture 26 and/or another opening 62 defined by another gap at the other end of the slot 25 toward the second end 22 of the substrate 20. The aperture 26 and/or the opening 62 define a pass-through location or a secondary gate location that is spaced apart from the first end 21 of the substrate 20 to generate a second flow of compound along the second surface 24 of the substrate 20 (shown by arrows $B_1$–$B_3$). The second flow of mold compound moves in a second direction away from the second 22 end of the substrate 20 toward the first end 21.

The process of fabricating the first and second casings 72 and 74 can be difficult because a third flow of mold compound may pass through the gap 61 between the die 40 and the substrate 20 at the end of the slot 25 toward the first end 21 of the substrate 20 (arrow $D_1$). Such a third flow of mold compound would move counter to the second flow of mold compound along the second surface 24 of the substrate 20. As a result, voids or other disparities may be created in the second casing 74 where the third flow of mold compound (arrow $D_1$) meets the second flow of mold compound (arrows $B_1$–$B_3$). One aspect of the present invention is to inhibit creating the third flow of mold compound that moves in the first direction along the second surface 24 of the substrate 20 between the first end of the substrate 21 and the pass-through location toward the second end 22 of the substrate 20.

Figure 3A:
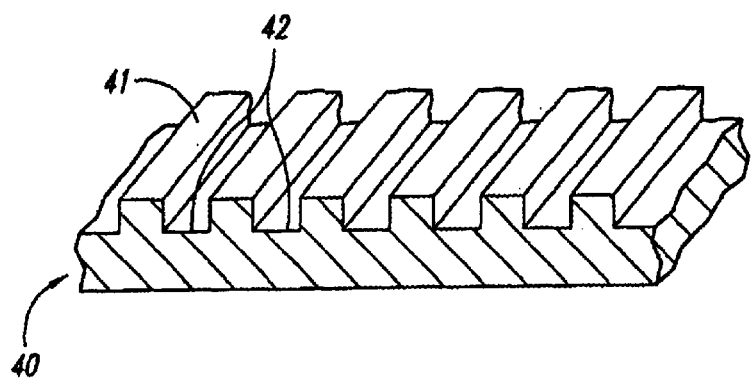
FIG. 3A is a top plan view of a first mold section for encapsulating a microelectronic device in accordance with an embodiment of the invention.
Figure 3B:
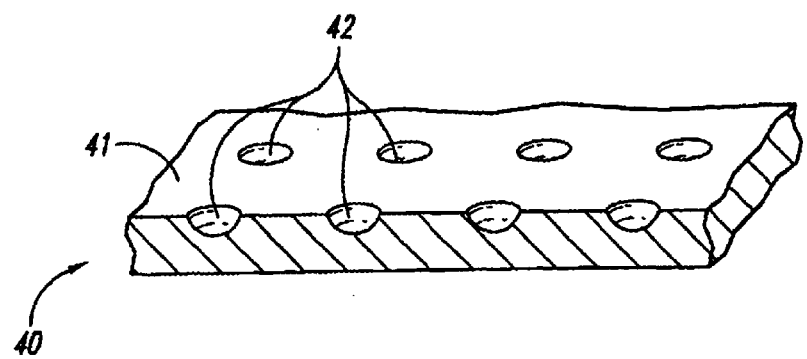
FIG. 3B is a bottom plan view of a second mold section for use with the first mold section of FIG. 3A.

FIG. 3A is a top plan view of a first mold section 100 and FIG. 3B is a bottom plan view of a second mold section 200 for forming the first and second casings 72 and 74 (FIG. 2) in a manner that inhibits or eliminates a third flow of mold compound through the gap 61 (FIG. 1) between the substrate 20 and the die 40. The embodiment of the first mold section 100 shown in FIG. 3A includes a first end 102, a second end 103, a bearing surface 120 for contacting the first side 23 of the substrate 20 (FIG. 1), and a first cavity 104 for receiving the die 40 (FIG. 1). The cavity 104 can have a first side 105, a second side 106 opposite the first side, a first end 107, and a second end 108 opposite the first end. The first mold section 100 can also include a plurality of gates including at least a first gate 110a and a second gate 110b that are separated from one another by an island 112. The first gate 110a can open into the cavity 104 at a location proximate to the first side 105, and the second gate 110b can open into the cavity 104 at a location proximate to the second side 106. The first and second gates 110a and 110b can meet at a common feed port 114. The first and second gates 110a and 110b define a gate pair that is coupled to a common first cavity 104 in the first mold section. The first mold section 100 can further include a flow restrictor 115 at the end of each of the first and second gates 110a and 110b. In operation, an injection flow F of molding compound or encapsulating compound is injected through the feed port 114 and the gates 110a and 110b. The island 112 splits the injection flow F into a first injection flow $F_1$ passing through the first gate 110a and a second injection flow $F_2$ passing through the second gate 110b.

FIG. 3B illustrates an embodiment of a second mold section 200 for forming the second casing 74 (FIG. 2) over the slot 25 of the substrate 20 (FIG. 1). The second mold section 200 can include a bearing surface 220 for contacting the second side 24 of the substrate 20 (FIG. 1). The second mold section 200 can also include a second cavity 225 configured to be superimposed over the slot 25 of the substrate 20 when the bearing surface 220 engages the first surface 24 of the substrate 20.

Figure 4:
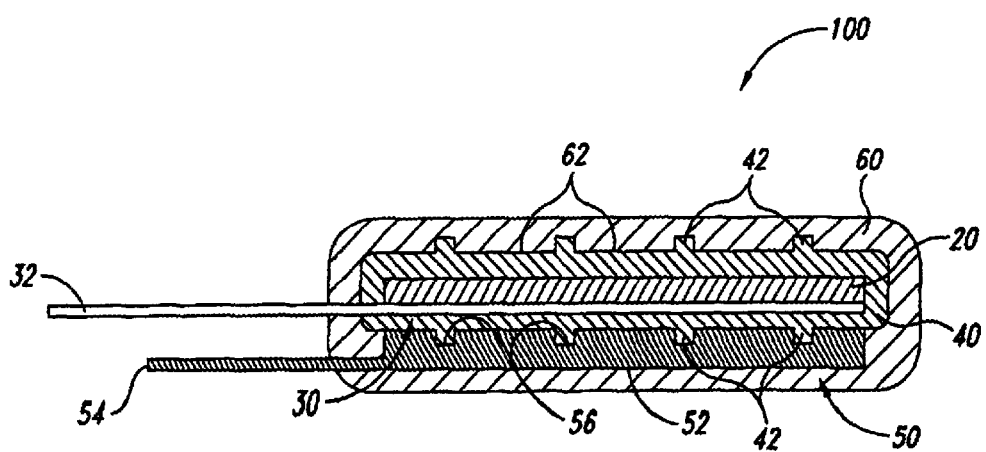
FIG. 4 is a partial front cross-sectional view of the first and second mold sections of FIGS. 3A and 3B in an operating position in accordance with an embodiment of the invention.

FIG. 4 is a partial cross-sectional view of a mold assembly 400 including the first mold section 100 shown in FIG. 3A and the second mold section 200 shown in FIG. 3B. The first mold section 100 is superimposed under the second mold section 200 so that the second cavity 225 of the second encapsulating section is over the first cavity 104 of the first mold section 100. The island 112 positions the opening of the first gate 110a toward the first side 105 of the first cavity 104 and the opening of the second gate 110b toward the second side 106 of the first cavity 104. Referring to FIGS. 3A and 4 together, the first injection flow $F_1$ flows through the first gate 110a and enters the cavity 104 proximate to the first side 105, and a second injection flow $F_2$ flows through the second gate 110b and enters the cavity 104 proximate to the second side 106.

The first mold section 100 can have a plurality of individual first cavities 104, and the second mold section 200 can have a plurality of individual second cavities 225. The first cavities 104 are arranged with respect to the second cavities 225 so that each first cavity 104 is superimposed under a corresponding second cavity 225. Additionally, the first mold section 100 can have a plurality of gate pairs that each have a first gate 110a and a second gate 110b. The openings of the first and second gates 110a and 110b of each gate pair are spaced apart from one another at the first end 107 of a corresponding first cavity 104. As such, the first mold section 100 can form a first casing 72 and a second casing 74 on a plurality of individual microelectronic devices in a single molding cycle in a manner that provides a bifurcated flow of mold compound into the first end of each of the first cavities 104.

FIGS. 5A and 5B illustrate an embodiment of a method for encapsulating the microelectronic die 40 and the slot 25 of the substrate 20. FIG. 5A, more specifically, is a partial front cross-sectional view illustrating the microelectronic device 10 being encapsulated using the first and second mold sections 100 and 200. In this embodiment, the bearing surface 120 of the first mold section 100 presses against a perimeter portion of the first surface 23 of the substrate 20, and the bearing surface 220 of the second mold section 200 presses against the second surface 24 of the substrate 20. The bearing surface 220 of the second mold section 200 can press against the second surface 24 of the substrate 20 by injecting a mold compound into the cavity 104, as explained in U.S. patent application No. 09/255,554, which is herein incorporated by reference. The first and second injection flows $F_1$ and $F_2$ of the mold compound pass through the first and second gates 110a and 110b to enter the cavity 104 along the side regions of the microelectronic die 40. As a result, the high pressure flow of mold compound does not flow directly toward the gap 61 (FIG. 1) between the substrate 20 and the die 40 proximate to the first end 21 of the substrate 20. The first and second injection flows $F_1$ and $F_2$ of the mold compound accordingly fill the first cavity 104 in a manner that does not cause the mold compound to generate a flow in the slot 25 of the substrate 20 that flows toward the second end 22 of the substrate 20. Therefore, the first and second gates 110a and 110b provide a mold that inhibits voids or other asperities from forming in the second casing 74. Moreover, the first mold section 100 surprisingly does not create voids or asperities in the first casing 72 even though it produces a bifurcated Dow of mold compound in the first cavity 104.

FIG. 5B is a side cross-sectional view illustrating the flow of mold compound through the first and second mold sections 100 and 200. The first and second injection flows $F_1$ and $F_2$ of mold compound flow past the island 112 and into the first end 107 of the first cavity 104 to create a first flow $A_1$ heading in a first direction toward the second end 22 of the substrate 20. The first flow $A_1$ of mold compound passes through the aperture 26 at the pass-through location toward the second end 22 of the substrate 20 to generate a second flow $B_1$ of mold compound that flows through the second cavity 225 of the second mold section 200. The second flow $B_1$ of mold compound fills the slot 25 of the substrate 20 and flows in a second direction until it reaches a terminal end 217 of the second cavity 225.

Figure 6:
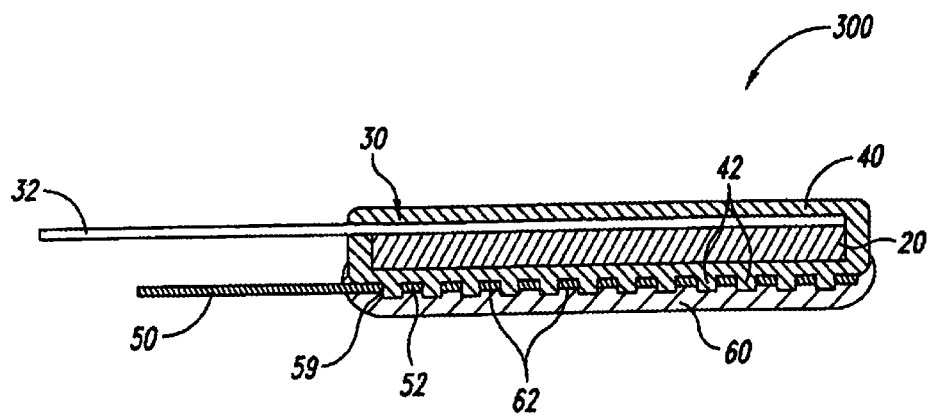
FIG. 6 is a top isometric view of a packaged microelectronic device before singulation in accordance with an embodiment of the invention.
Figure 1:
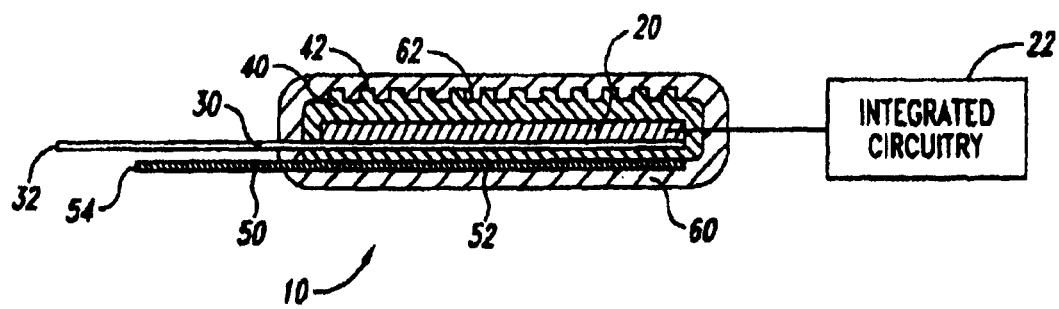
Figure 2:
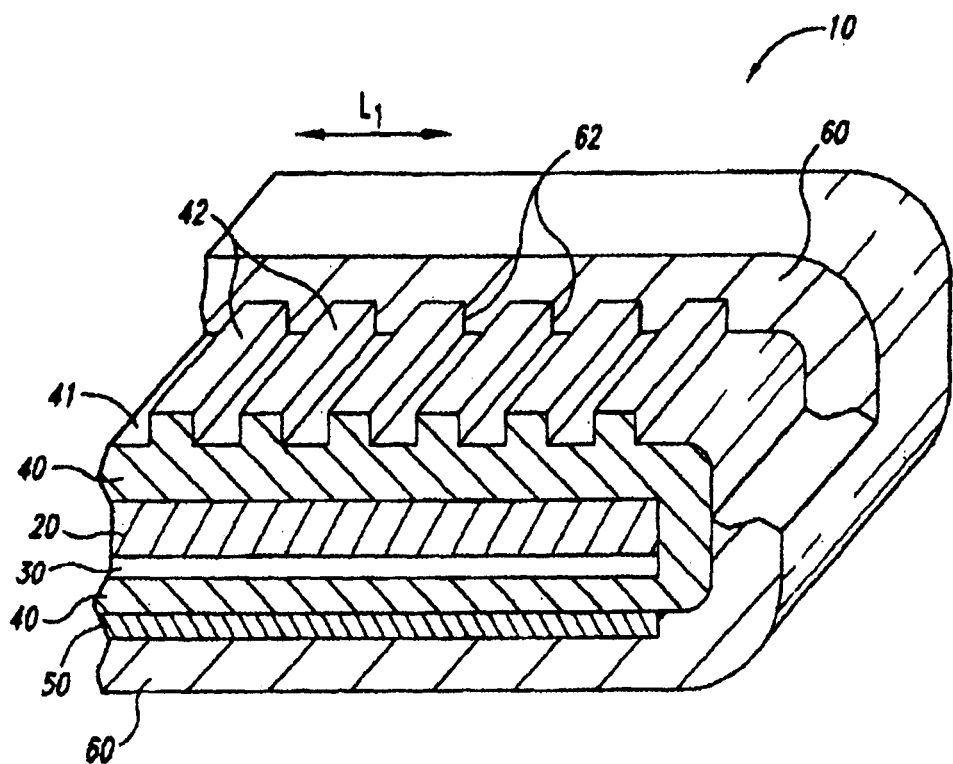
Figure 3A:
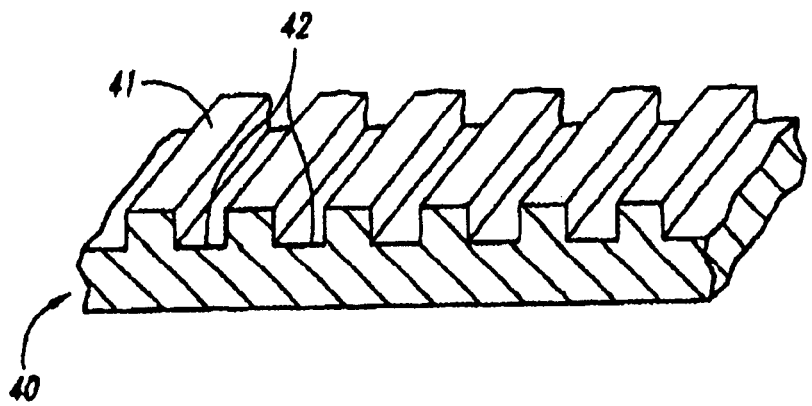
Figure 3B:
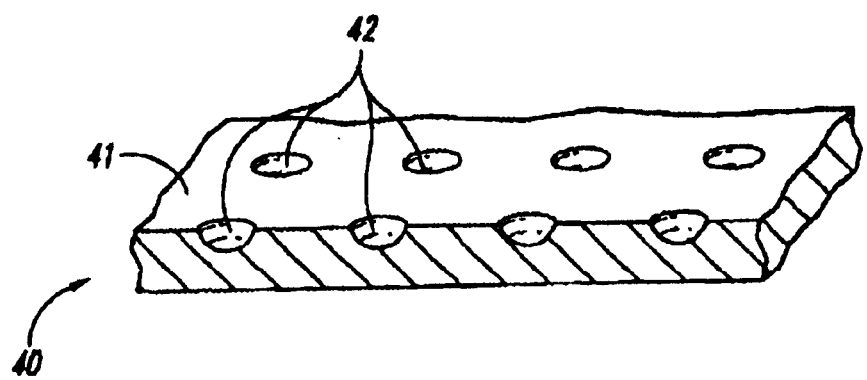
Figure 3C:
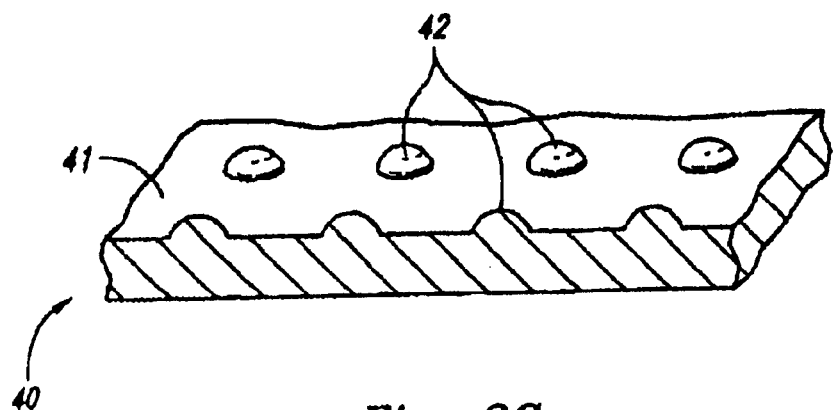
Figure 3D:
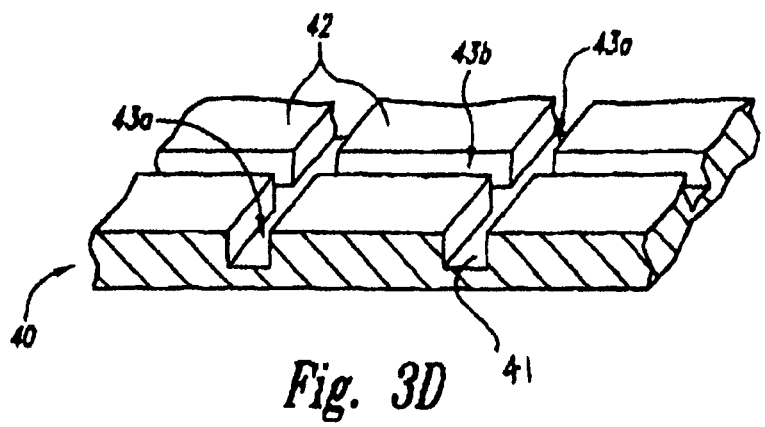
Figure 3E:
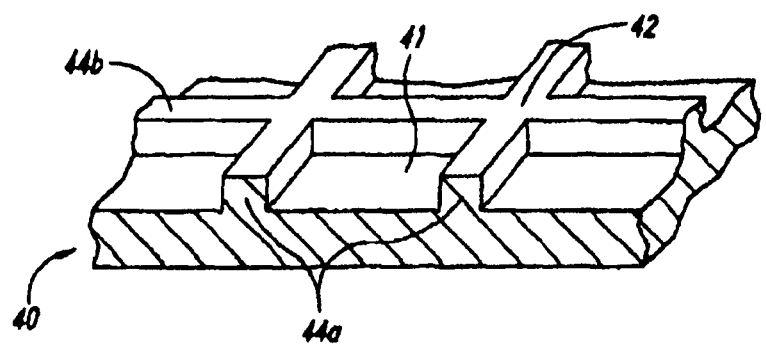
Figure 4:
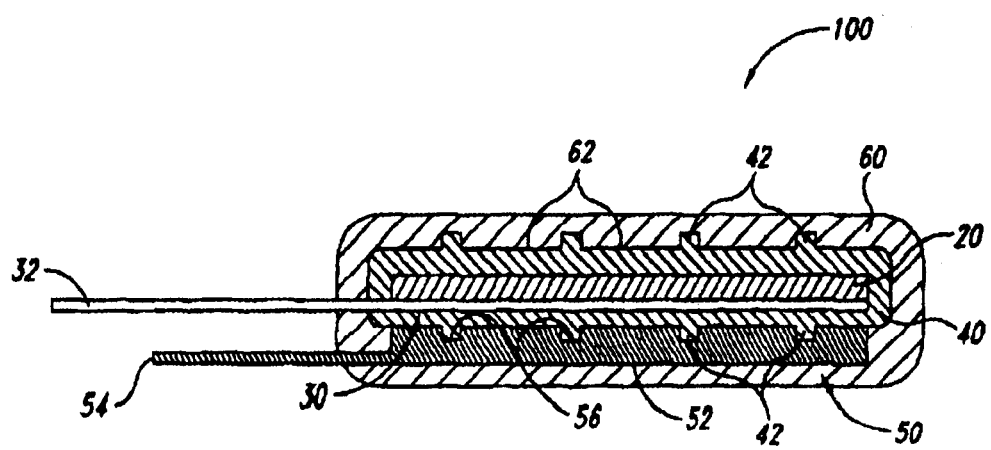
Figure 5:
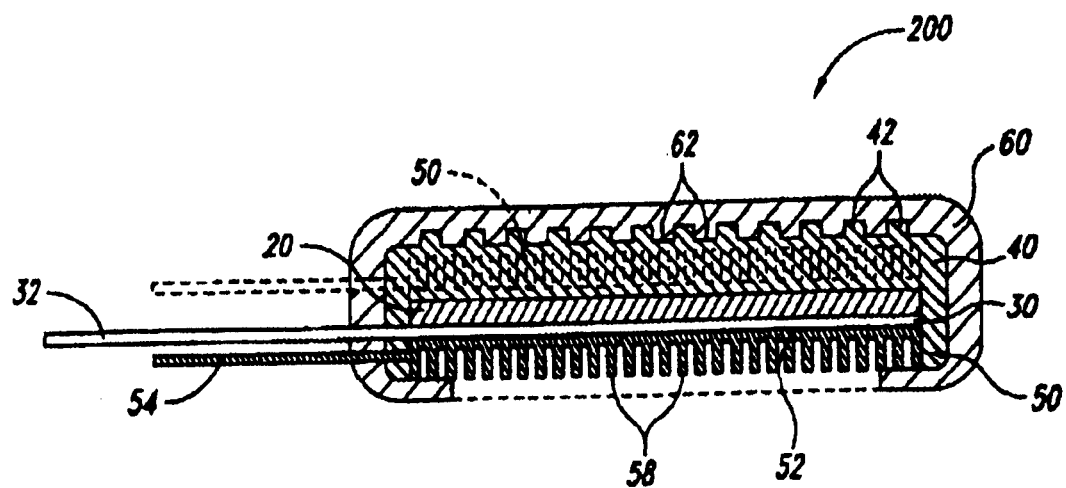
Figure 6:
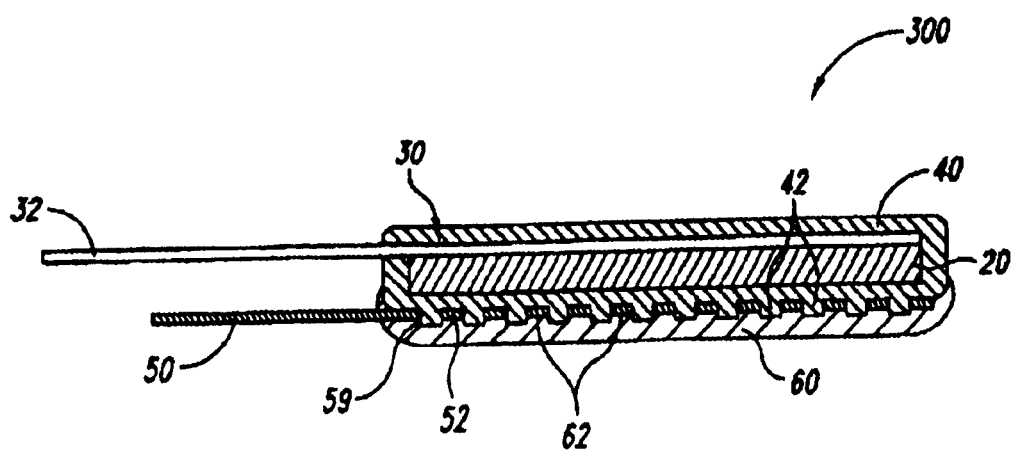

FIG. 6 is a top isometric view of an encapsulated microelectronic device 10 having the first casing 72 over the die 40 on the first surface 23 of the substrate 20. FIG. 6 illustrates the microelectronic device 10 before it has been "singulated" to remove unnecessary portions of the substrate 20 and molding compound. In this embodiment, the microelectronic die 40 (FIG. 1) and a portion of the substrate 20 are encapsulated by the first casing 72. Before singulating the device, the microelectronic device 10 includes a flash section 80 of mold compound having a first gate section 82 and second gate section 84. The first gate section 82 corresponds to the portion of the mold compound in the first gate 110a (FIG. 3A) at the end of the encapsulating process, and the second gate section 84 corresponds to the portion of the mold compound in the second gate 110b.

FIG. 7 is a bottom isometric view of the microelectronic device 10 having the second casing 74 over the slot 25 of the substrate 20. In this embodiment, the second casing 74 covers the terminal pads 28 (FIG. 1), the connectors 50 (FIG. 1), and the contacts 42 on the first surface 41 of the die 40 (FIG. 1). The microelectronic device 10 is then singulated to remove the excess portion of the flash 80 and the substrate 20.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A packaged microelectronic device, comprising:
die comprising integrated circuitry;
a first casing coating at least a portion of the die, the first casing having a plurality of first interconnect elements;
a heat sink proximate to the die; and
a second casing on at least a portion of the heat sink and coating at least a portion of the first casing, the second casing engaging the first interconnect elements of the first casing;
wherein the die is attached to a distribution member having a plurality of contacts coupled to integrated circuitry of the die;
wherein the first casing has interconnecting elements defined by first ridges extending across an outer surface of the first casing;
wherein the heat sink has a plurality of elongated slots through which the first ridges of the first casing extend, wherein a portion of the first ridges project beyond the heat sink; and
wherein the second casing has mating elements that receive the portions of the first ridges that project beyond the heat sink.

2. A packaged microelectronic device, comprising:
a die comprising integrated circuitry;
a first molded casing covering at least a portion of the die, the first casing having a plurality of first coupling elements;
a heat dissipation unit attached directly to one of the die and the first casing to dissipate heat generated by the integrated circuitry; and
a second molded casing in physical contact with at least a portion of the heat dissipation unit and at least a portion of the first casing, the second casing having a plurality second coupling elements interconnected with corresponding first coupling elements of the first casing;
wherein the first coupling elements are defined by first ridges extending across an outer surface of the first casing wherein the heat dissipation unit has a plurality of elongated slots through which the first ridges of the first casing extend, wherein a portion of the first ridges project beyond the heat dissipation unit; and
wherein the second casing has mating elements that receive the first ridges of the first casing.

3. The packaged device of claim 2 wherein the first casing comprises a first molded cover and the second casing comprises a second molded cover.

4. The packaged device of claim 2, wherein the die is attached to a distribution member having a plurality of contacts coupled to integrated circuitry of the die.

5. A packaged microelectronic device, comprising:
a die comprising integrated circuitry;
a first molded casing covering at least a portion of the die, the first casing having a plurality of first coupling elements;
a heat dissipation unit carried by one of the die and the first casing to dissipate heat generated by the integrated circuitry; and
a second molded casing encapsulating at least a portion of the heat dissipation unit and at least a portion of the first casing, the second casing having a plurality second coupling elements interconnected with corresponding first coupling elements of the first casing;
wherein the die is attached to a distribution member having a plurality of contacts coupled to integrated circuitry of the die;
wherein the first casing has coupling elements defined by first ridges extending across an outer surface of the first casing;
wherein the heat dissipation unit has a plurality of elongated slots through which the first ridges of the first casing extend, wherein a portion of the first ridges project beyond the heat dissipation unit; and
wherein the second casing has mating elements that receive the portions of the first ridges that project beyond the heat dissipation unit.

6. A packaged microelectronic device, comprising:
a semiconductor die comprising integrated circuitry and a plurality of bond-pads forming a memory device;
a distribution member having a plurality of contacts electrically coupled to the bond-pads;
a first casing enclosing at least a portion of the die, wherein the first casing comprises an outer surface and a plurality of engagement elements projecting from the outer surface and/or formed in the outer surface;
a heat dissipation unit attached directly to the die, the distribution member, and/or the first casing, the heat dissipation unit including a plurality of flanges, wherein at least a portion of the flanges are exposed to an outside environment; and
a second casing in the physical contact with the heat dissipation unit and enclosing at least a portion of the first casing, the second casing engaging the engagement elements of the first casing.

7. The packaged device of claim 6 wherein the first casing comprises a first molded cover and the second casing comprises a second molded cover, and the engagement elements comprise elongated ridges across the first cover that mate with elongated slots in the second cover.

8. The packaged device of claim 6 wherein the first casing comprises a first molded cover and the second casing comprises a second molded cover, and the engagement elements comprise striations on the first casing.

9. The packaged device of claim 6 wherein the first casing comprises a first molded cover and the second casing comprises a second molded cover, and the engagement elements comprise channels in the first cover that mate with ridges in the second cover.

10. The packaged device of claim 6 wherein:
the first casing has engagement elements defined by first ridges extending across an outer surface of the first casing;
the second casing has mating elements that receive the first ridges of the first casing; and
the packaged device further comprises a heat dissipation unit attached directly to the die.

11. The packaged device of claim 6 wherein:
the die is attached to a distribution member having a plurality of contacts coupled to integrated circuitry of the die;
the first casing has engagement elements defined by first ridges extending across an outer surface of the first casing;

the second casing has mating elements that receive the first ridges of the first casing; and the heat dissipation unit is attached directly to the distribution member.

12. The packaged device of claim 6, wherein the plurality of flanges is positioned inboard of the second casing.

13. A packaged microelectronic device, comprising:

a semiconductor die comprising integrated circuitry and a plurality of bond-pads forming a memory device;

a distribution member having a plurality of contacts electrically coupled to the bond-pads;

a first casing enclosing at least a portion of the die, wherein the first casing comprises a plurality of engagement elements on an outer surface; and a second casing enclosing at least a portion of the first casing, the second casing engaging the engagement element of the first casing;

wherein the die is attached to a distribution member having a plurality of contacts coupled to integrated circuitry of the die;

wherein the first casing has engagement elements defined by first ridges extending across an outer surface of the first casing;

wherein the packaged device further comprises a heat dissipation unit having a plurality of elongated slots through which the first ridges of the first casing extend, wherein a portion of the first ridges project beyond the heat dissipation unit; and wherein the second casing has mating elements that receive the portions of the first ridges that project beyond the heat dissipation unit.

14. A packaged microelectronic device, comprising:

a die comprising integrated circuitry;

a first casing coating at least a portion of the die, the first casing having an outer surface and a plurality of interconnect elements projecting from the outer surface and/or formed in the outer surface;

a heat sink proximate to the die, wherein the heat sink includes a plurality of receiving members that receive at least a portion of the interconnect elements of the first casing; and a second casing in physical contact with at least a portion of the heat sink and coating at least a portion of the first casing, the second casing engaging the interconnect elements of the first casing.

15. The packaged device of claim 14 wherein the first casing comprises a first molded cover and the second casing comprises a second molded cover, and the interconnect elements comprise elongated ridges across the first cover that mate with elongated slots in the second cover.

16. The packaged device of claim 14 wherein the first casing comprises a first molded cover and the second casing comprises a second molded cover, and the interconnect elements comprise striations on the first casing.

17. The packaged device of claim 14 wherein the first casing comprises a first molded cover and the second casing comprises a second molded cover, and the interconnect elements comprise channels in the first cover that mate with ridges in the second cover.

18. The packaged device of claim 14 wherein the first casing comprises a first molded cover and the second casing comprises a second molded cover, and the interconnect elements comprise depressions in the first cover that mate with protuberances from the second cover.

19. The packaged device of claim 14 wherein the first casing comprises a first molded cover and the second casing comprises a second molded cover, and the interconnect elements comprise protuberances from the first cover that mate with depressions in the second cover.

20. The packaged device of claim 14 wherein the first casing comprises a first molded cover and the second casing comprises a second molded cover, and the interconnect elements comprise lands projecting from the first cover, the lands being separated from one another by first channels extending in a first direction and second channels extending in a second direction transverse to the first direction.

21. The packaged device of claim 14 wherein the first casing comprises a first molded cover and the second casing comprises a second molded cover, and the interconnect elements comprise first ridges extending across the first cover in a first direction and second ridges extending across the cover in a second direction transverse to the first direction.

22. The packaged device of claim 14 wherein:

the first casing has interconnect elements defined by first ridges extending across a first side for the first casing and second ridges extending across a second side of the first casing;

the second casing has mating elements that receive the first ridges of the first casing; and the receiving members of the heat sink include channels that receive the second ridges of the first casing.

23. The packaged device of claim 14, wherein the die includes integrated circuitry forming a high-speed microelectronic device capable of operating at more than 500 Mhz.

* * * * *

UNITED STATES PATENT AND TRADEMARK OFFICE
CERTIFICATE OF CORRECTION

PATENT NO. : 7,067,905 B2
APPLICATION NO. : 10/215509
DATED : July 27, 2006
INVENTOR(S) : Brand It is certified that error appears in the above-identified patent and that said Letters Patent is hereby corrected as shown below:

Replace 7,067,905 in its entirety with the patent attached.

Signed and Sealed this

Twenty-seventh Day of July, 2010

David J. Kappos
*Director of the United States Patent and Trademark Office*

(12) United States Patent
Brand

(10) Patent No.: US 7,067,905 B2
(45) Date of Patent: Jun. 27, 2006

(54) PACKAGED MICROELECTRONIC DEVICES INCLUDING FIRST AND SECOND CASINGS

(75) Inventor: Joseph M. Brand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 10/215,509

(22) Filed: Aug. 8, 2002

(65) Prior Publication Data
US 2004/0026776 A1 Feb. 12, 2004

(51) Int. Cl.
*H01L 23/495* (2006.01)
*H01L 21/48* (2006.01)
*H05K 7/20* (2006.01)

(52) U.S. Cl. .................... 257/675; 257/707; 257/713; 257/720; 257/787; 257/796; 438/122; 438/123; 438/127; 361/704; 361/709; 361/710; 361/722

(58) Field of Classification Search ............... 257/717, 257/675, 707, 712, 713, 720, 730, 787, 788, 257/790, 796, 706; 361/688, 704, 707, 709, 361/710, 714, 722; 438/106, 110, 111, 112, 438/121–127

See application file for complete search history.

(56) References Cited

U.S. PATENT DOCUMENTS

| | | | | |
|---|---|---|---|---|
| 5,057,457 A | * | 10/1991 | Miyahara et al. | 264/272.14 |
| 5,343,074 A | * | 8/1994 | Higgins, III et al. | 257/668 |
| 5,394,010 A | * | 2/1995 | Tazawa et al. | 257/686 |
| 5,406,117 A | * | 4/1995 | Dlugokecki et al. | 257/659 |
| 5,430,331 A | * | 7/1995 | Hamzehdoost et al. | 257/796 |
| 5,593,927 A | | 1/1997 | Farnworth et al. | |
| 5,677,566 A | | 10/1997 | King et al. | |
| 5,696,033 A | | 12/1997 | Kinsman | |
| 5,698,899 A | * | 12/1997 | Hirakawa et al. | 257/712 |
| 5,739,585 A | | 4/1998 | Akram et al. | |
| D394,844 S | | 6/1998 | Farnworth et al. | |
| 5,804,468 A | * | 9/1998 | Tsuji et al. | 438/122 |
| D402,638 S | | 12/1998 | Farnworth et al. | |
| 5,851,845 A | | 12/1998 | Wood et al. | |
| 5,879,965 A | | 3/1999 | Jiang et al. | |
| 5,891,753 A | | 4/1999 | Akram | |
| 5,893,726 A | | 4/1999 | Farnworth et al. | |
| 5,898,224 A | | 4/1999 | Akram | |

(Continued)

FOREIGN PATENT DOCUMENTS

| | | | |
|---|---|---|---|
| JP | 63141353 A | * | 6/1988 |
| JP | 01220465 A | * | 9/1989 |
| JP | 04092459 A | * | 3/1992 |
| KR | 2001008825 A | * | 2/2001 |

*Primary Examiner*—Alonzo Chambliss
(74) *Attorney, Agent, or Firm*—Perkins Coie LLP

(57) ABSTRACT

Packaged microelectronic devices, methods for packaging microelectronic devices, and methods of operating microelectronic devices. In one embodiment, a packaged microelectronic device comprises a die including integrated circuitry, a first casing coating at least a portion of the die, a heat sink proximate to the die, and a second casing on at least a portion of the heat sink and coating at least a portion of the first casing. The first casing has a plurality of first interconnect elements, and the second casing engages the first interconnect elements to the first casing. The interconnect elements can be surface striations or other features that project into or away from the first casing. For example, the interconnect elements can be ridges extending across a surface of the first casing. In other embodiments, the first interconnect elements can be bumps and/or dimples across the surface of the first casing. The second casing can be molded around the first casing such that the material of the second casing conforms to or otherwise engages the first interconnect elements.

23 Claims, 4 Drawing Sheets

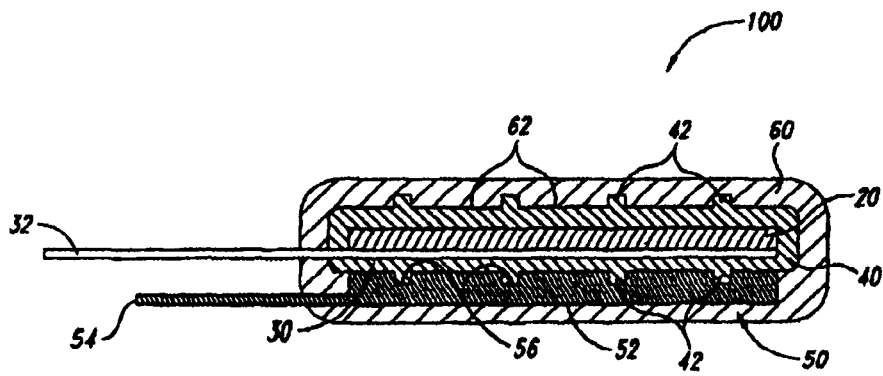

US 7,067,905 B2

U.S. PATENT DOCUMENTS

| Patent No. | Date | Inventor(s) |
|---|---|---|
| 5,933,713 A | 8/1999 | Farnworth |
| 5,938,956 A | 8/1999 | Hembree et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A * | 12/1999 | Brand ............... 438/126 |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,072,236 A | 6/2000 | Akram et al. |
| 6,075,288 A | 6/2000 | Akram |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,124,634 A | 9/2000 | Akram et al. |
| 6,133,068 A | 10/2000 | Kinsman |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,172,419 B1 | 1/2001 | Kinsman |
| 6,184,465 B1 | 2/2001 | Corisis |
| 6,198,172 B1 | 3/2001 | King et al. |
| 6,208,519 B1 | 3/2001 | Jiang et al. |
| 6,210,992 B1 | 4/2001 | Tandy et al. |
| 6,215,175 B1 | 4/2001 | Kinsman |
| 6,228,548 B1 | 5/2001 | King et al. |
| 6,229,202 B1 | 5/2001 | Corisis |
| 6,239,487 B1 * | 5/2001 | Park et al. ............... 257/712 |
| 6,246,108 B1 | 6/2001 | Corisis et al. |
| 6,246,110 B1 | 6/2001 | Kinsman et al. |
| 6,258,624 B1 | 7/2001 | Corisis |
| 6,259,153 B1 | 7/2001 | Corisis |
| 6,261,865 B1 | 7/2001 | Akram |
| 6,277,671 B1 | 8/2001 | Tripard |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,705 B1 | 12/2001 | Ahmad |
| 6,331,221 B1 | 12/2001 | Cobbley |
| 6,331,448 B1 | 12/2001 | Ahmad |
| 6,331,453 B1 | 12/2001 | Bolken et al. |
| 6,332,766 B1 | 12/2001 | Thummel |
| 6,344,976 B1 | 2/2002 | Schoenfeld et al. |
| 6,355,985 B1 | 3/2002 | Brand |
| 6,506,629 B1 * | 1/2003 | Kinsman et al. ............ 438/122 |
| 6,706,565 B2 * | 3/2004 | Brand ............... 438/126 |

* cited by examiner

PACKAGED MICROELECTRONIC DEVICES INCLUDING FIRST AND SECOND CASINGS

TECHNICAL FIELD

This invention relates to methods and apparatuses for packaging microelectronic devices and, in particular, to methods for encapsulating microelectronic dies in the manufacturing of memory devices, microprocessors and other types of microelectronic devices.

BACKGROUND

Microelectronic devices are generally complex, delicate components used in larger products. A typical microelectronic device includes a microelectronic die, a support structure attached to the die, and a protective casing encapsulating the die. The microelectronic die can be a semiconductor device (e.g., a microprocessor or a memory device), a field emission display, or another type of device. The support structure is generally a lead frame having a plurality of leads or an interposing substrate having electrically conductive traces and solder ball pads. The protective casing is generally a hard plastic, such as a thermosetting material, that is molded around the die. The protective casing encapsulates the die and a portion of the support structure to protect the die from environmental hazards and physical shocks.

The microelectronic dies includes integrated circuitry and a plurality of bond-pads that are coupled to the integrated circuitry. In a typical application for a DRAM memory device, a die will have a reference voltage ($V_{ref}$) bond-pad, a plurality of supply voltage ($V_{dd}$) and ground voltage ($V_{ss}$) bond-pads, a plurality of signal bond-pads (e.g., clock lines, address lines, and data lines), a column address strobe (CAS) bond-pad, and a row address strobe (RAS) pad. The bond-pads are often arranged in a fine pitch array on one side of the die, and each bond-pad is coupled to the appropriate voltage source or signal source. For example, the $V_{ref}$ bond-pad is coupled to a reference voltage source, the $V_{ss}$ and $V_{dd}$ bond-pads are coupled to appropriate electrical potentials, and the signal bond-pads are coupled to the correct signal sources. The support structures are accordingly configured so that the leads or traces couple to the bond-pads on the die to the corresponding voltage and signal sources.

The trend in microchip fabrication is to manufacture smaller and faster microelectronic dies for computers, cell phones, PDAs, and many other products. As the dies become faster and have larger capacities, the components of the integrated circuitry are much smaller and spaced closer together so that more components can be fabricated in the dies. The high densities of components and fast operating speeds increase the amount of heat produced by the dies. High performance microelectronic devices accordingly generate a significant amount of heat during operation.

A significant limiting factor for operating packaged microelectronic devices is dissipating the heat generated by high performance dies. The dies are sensitive components that are typically protected from physical contact and environmental conditions to avoid damaging the die. In many applications, the protective casings seal the die from environmental factors (e.g., moisture) and shield the die from electrical and mechanical shocks. The protective casings, however, also retain the heat generated by the dies. This may cause high performance dies to overheat to the extent that the dies malfunction or are damaged.

One conventional technique to dissipate the heat from packaged devices is to bond a heat sink to an external surface of the casing encapsulating a die. The heat sink is typically attached to the casing using an epoxy or other adhesive. One drawback of this is that the heat generated by high performance dies may raise the temperature of the epoxy to a level at which it fails. Therefore, existing packaged microelectronic devices with heat sinks do not provide adequate solutions for operating high performance dies.

SUMMARY

The present invention is directed toward packaged microelectronic devices, methods for packaging microelectronic devices, and methods of operating microelectronic devices. In one embodiment, a packaged microelectronic device comprises a die including integrated circuitry, a first casing coating at least a portion of the die, a heat sink proximate to the die, and a second casing on at least a portion of the heat sink and coating at least a portion of the first casing. The first casing has a plurality of first interconnect elements, and the second casing engages the first interconnect elements to the first casing. The interconnect elements can be surface striations or other features that project into or away from the first casing. For example, the interconnect elements can be ridges extending across a surface of the first casing. In other embodiments, the first interconnect elements can be bumps and/or dimples across the surface of the first casing. The second casing can be molded around the first casing such that the material of the second casing conforms to or otherwise mates with the first interconnect elements.

Another embodiment of a packaged microelectronic device comprises a die including integrated circuitry, a first molded casing covering at least a portion of the die, a heat dissipation unit carried by one of the die and the first casing, and a second molded casing encapsulating at least a portion of the heat dissipation unit and at least a portion of the first casing. The first casing includes a plurality of first coupling elements, and the second casing includes a plurality of second coupling elements interconnected with corresponding first coupling elements of the first casing. The second coupling element, for example, can be molded to mate with the first coupling elements.

Another embodiment of a packaged microelectronic device comprises a semiconductor die comprising integrated circuitry and a plurality of bond-pads that form a memory device, a distribution member having a plurality of contacts electrically coupled to the bond-pads, a first casing enclosing at least a portion of the die, and a second casing enclosing at least a portion of the first casing. The first casing can further include a plurality of engagement elements on an outer surface of the first casing, and the second casing can include mating elements that engage the engagement elements of the first casing. In each of the foregoing embodiments, the interconnect elements, coupling elements, or engagement elements enhance the bond between the first casing and the second casing to inhibit delamination between the casings.

Other aspects of the present invention are directed toward methods for fabricating microelectronic devices. In one embodiment, a method of manufacturing a microelectronic device includes forming a first casing to cover at least a portion of a die having an integrated circuit. The method also includes covering a portion of the first casing with a second casing. The act of forming a first casing further includes forming a plurality of interconnecting elements on the outer surface of the first casing. The act of covering a portion of the first casing with the second casing further includes engaging a portion of the second casing with the interconnect elements of the first casing.

Another embodiment of a method for manufacturing a microelectronic device includes providing a die having an integrated circuit, encasing at least a portion of the die with a first casing, positioning a heat sink proximate to the die, and covering at least a portion of the first casing and the heat sink with a second casing. The first casing includes coupling elements, and the second casing includes mating elements that engage corresponding coupling elements.

Still another embodiment of a method for manufacturing a microelectronic device comprises providing a die having integrated circuitry that defines a memory device and a plurality of bond-pads coupled to the integrated circuitry. This embodiment also includes attaching the die to a distribution member having a plurality of electrical connectors, and electrically coupling the bond-pads on the die to corresponding electrical connectors on the distribution member. This method continues by molding a first casing to enclose at least a portion of the die and the distribution member; positioning a heat dissipation unit proximate to at least one of the die, the distribution member, and/or the first casing; and molding a second casing to enclose at least a portion of the first casing and the heat dissipation unit. The first casing is molded to include a coupling member on the first casing, and the second casing is molded so that the second casing engages the coupling member of the first casing.

BRIEF DESCRIPTION OF THE DRAWINGS

FIG. 1 is a schematic cross-sectional view of a microelectronic device in accordance with an embodiment of the invention.

FIG. 2 is a schemaic cross-sectional view that isometrically illustrates a portion of the microelectronic device of FIG. 1.

FIGS. 3A-3E are schematic cross-secional views of first casings for use in microelectronic devices in accordance with various embodiments of the invention.

FIG. 4 is a schematic cross-sectional view of a microelectronic device in accordance with another embodiment of the invention.

Figure 5:
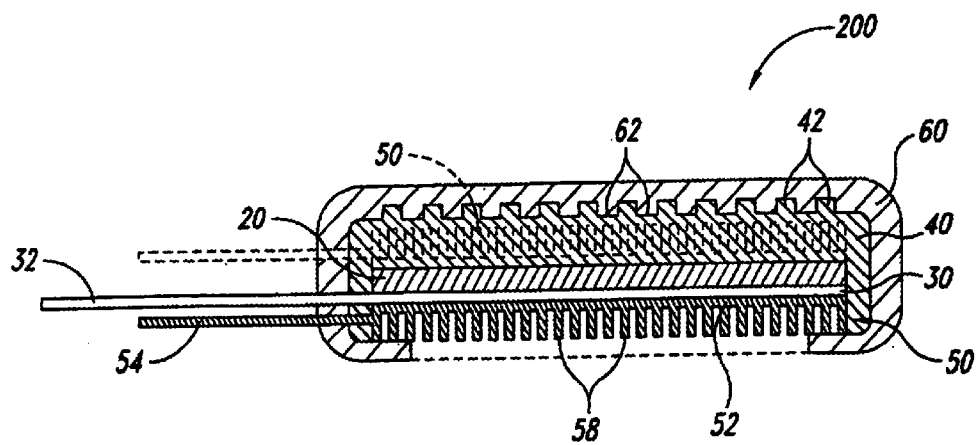
FIG. 5A is a partial front cross-sectional view of a microelectronic device being packaged using the first and second mold sections of FIG. 4 according to an embodiment of the invention.
FIG. 5B is a side cross-sectional view of the microelectronic device of FIG. 5A being packaged using the first and second mold sections of FIG. 4 in accordance with an embodiment of the invention.

FIG. 5 is a schematic cross-sectional view of a microelectronic device in accordance with yet another embodiment of the invention.

FIG. 6 is a schematic cross-sectional view of a microelectronic device in accordance with still another embodiment of the invention.

DETAILED DESCRIPTION

The present invention is directed toward microelectronic device assemblies, methods for manufacturing microelectronic devices, and methods for operating microelectronic device assemblies. The term "microelectronic device" is used throughout to include devices that have integrated circuits, such as processors, memory devices, field emission displays, and many other types of devices. Thus, even though several embodiments of the present invention are described with respect to memory devices, the methods and apparatus are also applicable to other types of microelectronic devices. Additionally, although the following embodiments of the invention described with reference to FIGS. 1-6 disclose microelectronic devices that have a die mounted on a lead frame, the invention is also applicable to other devices in which a die is mounted on an interposer substrate, such as board-on-chip, chip-on-board, and flip-chip packages. One skilled in the art will accordingly understand that the present invention may have other embodiments in addition to those disclosed below and that such additional embodiments of the invention may be practiced with additional feature or without several elements of the embodiments shown in FIGS. 1-6.

FIG. 1 is a schematic cross-sectional view of a microelectronic device 10 in accordance with an embodiment of the invention. The microelectronic device 10 includes a die 20 that has integrated circuitry 22. The integrated circuitry 22 can form a memory device, such as a DRAM, SRAM, RDRAM, or other type of memory. The integrated circuitry 22 can alternatively form a processor, amplifier, resonator, or other type of microelectronic device. In general, the integrated circuitry includes a large number of very small sub-micron components, such as transistors, conductive lines, contacts, and many other components. The embodiment of the microelectronic device 10 shown in FIG. 1 also includes a distribution member 30 having a plurality of contacts 32. The die 20 is mounted to the distribution member 30 so that the contacts 32 are electrically coupled to the integrated circuitry. For example, the die 20 typically includes a plurality of bond-pads (not shown) that can be wire-bonded to the contacts 32 using techniques known in the art. It will be appreciatred that the bond-pad on the die 20 can also be coupled to the contacts 32 using flip-chip techniques known in the art. The distribution member 30 can accordingly be a metal lead frame or an interposer substrate with printed circuitry and ball-pads for a ball-grid array. Suitable configurations that use a lead frame or interposer substrate are disclosed in U.S. Pat. No. 6,355,985B1 and U.S. application Ser. No. 09/595,623, which are incorporated herein by reference.

FIG. 2 is a schematic cross-sectional view that isometrically illustrates a portion of the microelectronic device 10 of FIG. 1 in greater detail. Referring to FIGS. 1 and 2 together, the microelectronic device 10 can further include a first casing 40, a heat dissipation unit 50, and a second casing 60. The first casing 40 covers or otherwise coats at least a portion of the die 20. The first casing 40, for example, can be molded using injection molding techniques and compounds known in the art of packaging microelectronic devices. In the embodiment shown in FIG. 1, the first casing 40 is molded to completely encapsulate or otherwise enclose the die 20. The contacts 32 of the distribution member 30 are not encapsulated by the first casing 40. The contacts 32 can accordingly be coupled to signal lines and voltage sources.

The first casing 40 has an outer surface 41 and a plurality of coupling elements 42. The coupling elements 42 can be features that project into or away from the outer surface 41. The coupling elements 42 are preferably surface features of the first casing 40 that provide interconnecting elements or engaging elements for securing the second casing 60 to the first casing 40. In the embodiment shown in FIGS. 1 and 2, the first coupling elements 42 are ridges or striations extending across the outer surface 41 of the first casing 40. The first coupling elements 42 can have several different configurations, and some additional configurations are described below with reference to FIGS. 3A-3E.

The heat dissipation unit 50 is carried by one of the die 20, the first casing 40, and/or the second casing 60. The heat dissipation unit 50 is typically a thermally conductive member, such as a metal frame or panel, that draws heat away from the die 20 and the first casing 40. The heat dissipation unit 50 can include a main panel 52 (FIG. 1) and a plurality of leads 54 (FIG. 1). In the embodiment shown in FIGS. 1 and 2, the main panel 52 is attached to the outer surface of the first casing 40, and the leads 54 extend outwardly beyond the first casing 40. The leads 54 can be coupled to a cooling unit to continually draw heat away from the first casing 40. The heat dissipation unit 50 is accordingly a heat sink positioned proximate to the die 20 for dissipating heat generated by the integrated circuitry 22 in the die 20.

The second casing 60 encapsulates at least a portion of the heat dissipation unit 50 and the first casing 40. In the embodiment shown in FIGS. 1 and 2, the second casing 60 completely encapsulates the first casing 40 and the main panel 52 of the heat dissipation unit 50. The second casing 60 can be molded around the first casing 40 such that the second casing engages the first coupling elements 42. The molding process can accordingly form a plurality of second coupling elements 62 in the second casing 60. The second coupling elements 62 generally mate with or otherwise engage the first coupling elements 42. In other embodiments, the second casing 60 is molded around only a portion of the first casing 40 and a portion of the main panel 52.

The first casing 40 and the second casing 60 can be formed from molding compounds used in injection molding processes for encapsulating microelectronic dies. Many suitable molding compounds are known in the art. In a typical application, the first casing 40 and the second casing 60 can be molded from the same compound. In other applications, the first casing 40 and the second casing 60 are molded from different compounds.

The microelectronic device 10 shown in FIGS. 1 and 2 can be manufactured by first attaching the die 20 to the distribution member 30 and then electrically coupling bond-pads on the die 20 to the connectors 32 (FIG. 1) of the distribution member 30 using wire-bonding or flip-chip techniques known in the art. The assembly of the die 20 and the distribution member 30 is then placed in a first injection mold that is configured to form the first coupling elements 42. Suitable injection molding techniques for lead frame devices or devices having interposing substrates are disclosed in U.S. Pat. No. 6,355,985B1 and U.S. application Ser. No. 09/595,623, which are incorporated in their entirety by reference above. The heat dissipation unit 50 is then attached to the outer surface 41 of the first casing 40. After attaching the heat dissipation unit 50 to the first casing 40, the second casing 60 is molded around the first casing 40 and the heat dissipation member 50. The second casing 60 can be molded by placing the assembly of the die 20, the distribution member 30, the first casing 40, and the heat dissipation unit 50 in a second mold. A molding compound is then injected into the second mold. After molding the second casing 60, the microelectronic device 10 can be processed in a final procedure in which the contacts 32 and the lead 54 are cut and/or bent into a desired configuration.

The particular embodiment of the microelectronic device 10 shown in FIGS. 1 and 2 is expected to inhibit or otherwise prevent delamination between the first casing 40 and the second casing 60. One concern of manufacturing a device with two casings is that the packaged device is subject to high temperature procedures that may affect the bond between the first casing 40 and the second casing 60. For example, burn-in processes or reflow processes may cause the second casing 60 to delaminate from the first casing 40. The coupling elements 42 and 62 in the embodiment of the microelectronic device 10 are expected to inhibit such delamination. The first coupling elements 42 and the second coupling elements 62 increase the surface area over which the first casing 40 interfaces with the second casing 60. Such an increase in surface area is expected to enhance the bond between the two casings. Additionally, the interface between the first coupling elements 42 and the second coupling elements 62 prevents relative movement between the first casing 40 and the second casing 60 laterally in a direction indicated by arrow $L_1$ (FIG. 2). Therefore, the embodiment of the microelectronic die 10 shown in FIGS. 1 and 2 is expected to be less susceptible to being damaged because of delamination or other irregularities in the first casing 40 and the second casing 60.

Figure 3C:
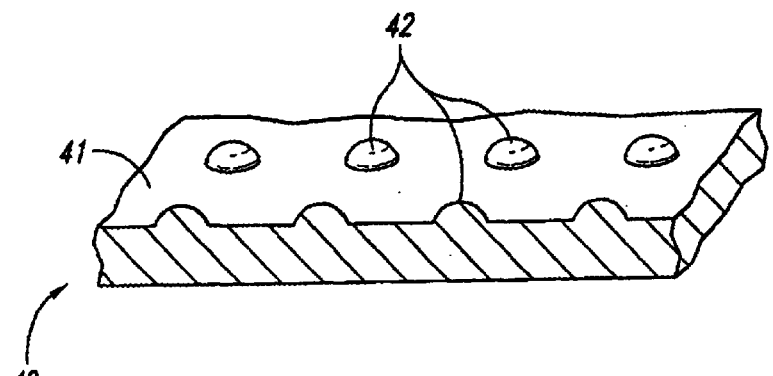
Figure 3D:
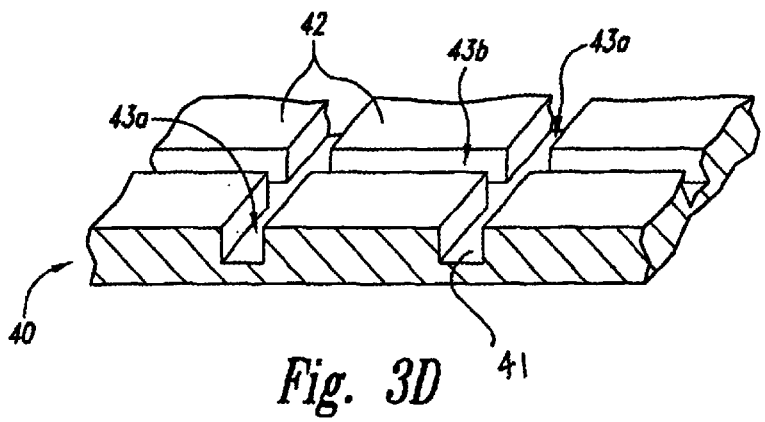
Figure 3E:
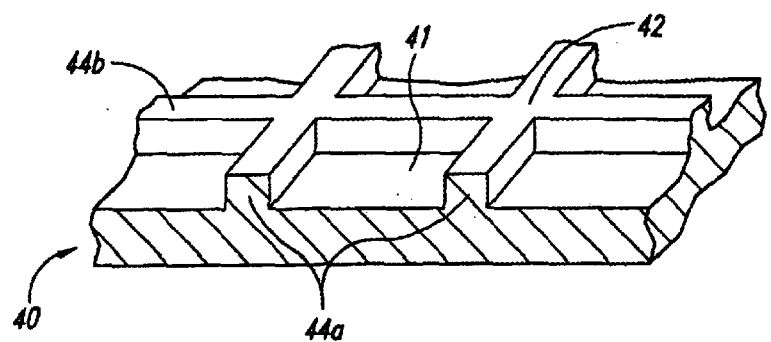

FIGS. 3A-3E are schematic cross-sectional views illustrating a portion of a number of different embodiments of the first casing 40. Referring to FIG. 3A, the first casing 40 in this embodiment has an outer surface 41 and a plurality of coupling elements 42 defined by channels that project inwardly from the outer surface 41. FIG. 3B illustrates an embodiment of the first casing 40 in which the coupling elements 42 are dimples or other types of depressions that project inwardly from the outer surface 41. FIG. 3C illustrates an embodiment of the first casing 40 in which the first coupling elements 42 are mounds or other types of protuberances that project outwardly from the outer surface 41. FIG. 3D illustrates an embodiment of the first casing 40 in which the first coupling elements 42 are raised lands that project outwardly relative to the outer surface 41. The lands 42 are configured to define a plurality of first channels 43a that extend in one direction and a plurality of second channels 43b that extend in a direction transverse to the first channels 43a. FIG. 3E illustrates another embodiment of the first section 40 having a first coupling element 42 including a plurality of first sections 44a extending in one direction and a plurality of second sections 44b extending transversely to the first sections 44a. The first and second sections 44a-b of the first coupling element 42 can be first and second ridges that project away from the outer surface 41. It will be appreciated that the second casing 60 is molded around the first casing 40 so that the second casing 60 has mating elements that conform to the contour of any of the coupling elements 42 illustrated in FIGS. 3A-3E. Therefore, the embodiments of the first casing 40 shown in FIGS. 3A-3E are expected to perform in a manner similar to that described above with reference to FIGS. 1 and 2.

FIG. 4 is a schematic cross-sectional view of a microelectronic device 100 in accordance with another embodiment of the invention. Like reference numbers refer to like components in FIGS. 1-4. The microelectronic device 100 includes a first casing 40 having a first side, a second side, and first coupling elements 42 on both the first and second sides. The heat dissipation unit 50 accordingly includes receiving members 56 that receive the first coupling elements 42 on the second side of the casing. The receiving members 56 can be channels corresponding to elongated ridges on the first casing 40. The interface between the first coupling elements 42 and the receiving members 56 is expected to enhance the bond between the first casing 40 and the heat dissipation unit 50. Additionally, the increased surface area between the first casing 40 and the heat dissipation unit 50 is also expected to enhance the heat transfer rate between the die 20 and the heat dissipation unit 50.

FIG. 5 is a schematic cross-sectional view of a microelectronic device 200 in accordance with yet another embodiment of the invention. Like-reference numbers refer to like components in FIGS. 1-5. In the microelectronic device 200, the heat dissipation unit 50 is mounted directly to the distribution member 30. It will be appreciated that the heat dissipation unit 50 can alternatively be mounted to the backside of the die 20 (shown in broken lines). In this embodiment, the heat dissipation unit 50 includes a plurality of flanges 58, and the first casing 40 covers the die 20 and a side portion of the heat dissipation unit 50. The second casing 60 covers the first casing 40 and a portion of the flanges 58 of the heat dissipation unit 50. Accordingly, the remainder of the flanges 58 of the heat dissipation unit 50 are exposed to enhance the cooling effect of the heat dissipation unit 50. It will be appreciated that the second casing 60 can completely encapsulate the flanges 58 of the heat dissipation unit 50 (shown in broken lines) in a different embodiment.

FIG. 6 is a schematic cross-sectional view of a microelectronic device 300 in accordance with still another embodiment of the invention. Like reference numbers refer to like components in FIGS. 1-6. In this embodiment, the microelectronic device 300 includes a heat dissipation unit 50 having a plurality of slots 59 that receive the first coupling elements 42 of the first casing 40. The second casing 60 covers only a portion of the first casing 40 to encapsulate the main panel 52 of the heat dissipation unit 50 and the first coupling elements 42 of the first casing 40. The second casing 60 conforms to the portion of the first coupling elements 42 that project through the slots 59. The second casing 60 accordingly includes a plurality of the second coupling elements 62 that are interconnected with corresponding first coupling elements 42.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A packaged microelectronic device, comprising:
   die comprising integrated circuitry;
   a first casing coating at least a portion of the die, the first casing having a plurality of first interconnect elements;
   a heat sink proximate to the die; and
   a second casing on at least a portion of the heat sink and coating at least a portion of the first casing, the second casing engaging the first interconnect elements of the first casing;
   wherein the die is attached to a distribution member having a plurality of contacts coupled to integrated circuitry of the die;
   wherein the first casing has interconnecting elements defined by first ridges extending across an outer surface of the first casing;
   wherein the heat sink has a plurality of elongated slots through which the first ridges of the first casing extend, wherein a portion of the first ridges project beyond the heat sink; and
   wherein the second casing has mating elements that receive the portions of the first ridges that project beyond the heat sink.

2. A packaged microelectronic device, comprising:
   a die comprising integrated circuitry;
   a first molded casing covering at least a portion of the die, the first casing having a plurality of first coupling elements;
   a heat dissipation unit attached directly to one of the die and the first casing to dissipate heat generated by the integrated circuitry; and
   a second molded casing in physical contact with at least a portion of the heat dissipation unit and at least a portion of the first casing, the second casing having a plurality second coupling elements interconnected with corresponding first coupling elements of the first casing;
   wherein the first coupling elements are defined by first ridges extending across an outer surface of the first casing wherein the heat dissipation unit has a plurality of elongated slots through which the first ridges of the first casing extend, wherein a portion of the first ridges project beyond the heat dissipation unit; and
   wherein the second casing has mating elements that receive the first ridges of the first casing.

3. The packaged device of claim 2 wherein the first casing comprises a first molded cover and the second casing comprises a second molded cover.

4. The packaged device of claim 2, wherein the die is attached to a distribution member having a plurality of contacts coupled to integrated circuitry of the die.

5. A packaged microelectronic device, comprising:
   a die comprising integrated circuitry;
   a first molded casing covering at least a portion of the die, the first casing having a plurality of first coupling elements;
   a heat dissipation unit carried by one of the die and the first casing to dissipate heat generated by the integrated circuitry; and
   a second molded casing encapsulating at least a portion of the heat dissipation unit and at least a portion of the first casing, the second casing having a plurality second coupling elements interconnected with corresponding first coupling elements of the first casing;
   wherein the die is attached to a distribution member having a plurality of contacts coupled to integrated circuitry of the die;
   wherein the first casing has coupling elements defined by first ridges extending across an outer surface of the first casing;
   wherein the heat dissipation unit has a plurality of elongated slots through which the first ridges of the first casing extend, wherein a portion of the first ridges project beyond the heat dissipation unit; and
   wherein the second casing has mating elements that receive the portions of the first ridges that project beyond the heat dissipation unit.

6. A packaged microelectronic device, comprising:
   a semiconductor die comprising integrated circuitry and a plurality of bond-pads forming a memory device;
   a distribution member having a plurality of contacts electrically coupled to the bond-pads;
   a first casing enclosing at least a portion of the die, wherein the first casing comprises an outer surface and a plurality of engagement elements projecting from the outer surface and/or formed in the outer surface;
   a heat dissipation unit attached directly to the die, the distribution member, and/or the first casing, the heat dissipation unit including a plurality of flanges, wherein at least a portion of the flanges are exposed to an outside environment; and
   a second casing in the physical contact with the heat dissipation unit and enclosing at least a portion of the first casing, the second casing engaging the engagement elements of the first casing.

7. The packaged device of claim 6 wherein the first casing comprises a first molded cover and the second casing comprises a second molded cover, and the engagement elements comprise elongated ridges across the first cover that mate with elongated slots in the second cover.

8. The packaged device of claim 6 wherein the first casing comprises a first molded cover and the second casing comprises a second molded cover, and the engagement elements comprise striations on the first casing.

9. The packaged device of claim 6 wherein the first casing comprises a first molded cover and the second casing comprises a second molded cover, and the engagement elements comprise channels in the first cover that mate with ridges in the second cover.

10. The packaged device of claim 6 wherein:
the first casing has engagement elements defined by first ridges extending across an outer surface of the first casing;
the second casing has mating elements that receive the first ridges of the first casing; and
the packaged device further comprises a heat dissipation unit attached directly to the die.

11. The packaged device of claim 6 wherein:
the die is attached to a distribution member having a plurality of contacts coupled to integrated circuitry of the die;
the first casing has engagement elements defined by first ridges extending across an outer surface of the first casing;
the second casing has mating elements that receive the first ridges of the first casing; and
the heat dissipation unit is attached directly to the distribution member.

12. The packaged device of claim 6, wherein the plurality of flanges is positioned inboard of the second casing.

13. A packaged microelectronic device, comprising:
a semiconductor die comprising integrated circuitry and a plurality of bond-pads forming a memory device;
a distribution member having a plurality of contacts electrically coupled to the bond-pads;
a first casing enclosing at least a portion of the die, wherein the first casing comprises a plurality of engagement elements on an outer surface; and
a second casing enclosing at least a portion of the first casing, the second casing engaging the engagement element of the first casing;
wherein the die is attached to a distribution member having a plurality of contacts coupled to integrated circuitry of the die;
wherein the first casing has engagement elements defined by first ridges extending across an outer surface of the first casing;
wherein the packaged device further comprises a heat dissipation unit having a plurality of elongated slots through which the first ridges of the first casing extend, wherein a portion of the first ridges project beyond the heat dissipation unit; and
wherein the second casing has mating elements that receive the portions of the first ridges that project beyond the heat dissipation unit.

14. A packaged microelectronic device, comprising:
a die comprising integrated circuitry;
a first casing coating at least a portion of the die, the first casing having an outer surface and a plurality of interconnect elements projecting from the outer surface and/or formed in the outer surface;
a heat sink proximate to the die, wherein the heat sink includes a plurality of receiving members that receive at least a portion of the interconnect elements of the first casing; and
a second casing in physical contact with at least a portion of the heat sink and coating at least a portion of the first casing, the second casing engaging the interconnect elements of the first casing.

15. The packaged device of claim 14 wherein the first casing comprises a first molded cover and the second casing comprises a second molded cover, and the interconnect elements comprise elongated ridges across the first cover that mate with elongated slots in the second cover.

16. The packaged device of claim 14 wherein the first casing comprises a first molded cover and the second casing comprises a second molded cover, and the interconnect elements comprise striations on the first casing.

17. The packaged device of claim 14 wherein the first casing comprises a first molded cover and the second casing comprises a second molded cover, and the interconnect elements comprise channels in the first cover that mate with ridges in the second cover.

18. The packaged device of claim 14 wherein the first casing comprises a first molded cover and the second casing comprises a second molded cover, and the interconnect elements comprise depressions in the first cover that mate with protuberances from the second cover.

19. The packaged device of claim 14 wherein the first casing comprises a first molded cover and the second casing comprises a second molded cover, and the interconnect elements comprise protuberances from the first cover that mate with depressions in the second cover.

20. The packaged device of claim 14 wherein the first casing comprises a first molded cover and the second casing comprises a second molded cover, and the interconnect elements comprise lands projecting from the first cover, the lands being separated from one another by first channels extending in a first direction and second channels extending in a second direction transverse to the first direction.

21. The packaged device of claim 14 wherein the first casing comprises a first molded cover and the second casing comprises a second molded cover, and the interconnect elements comprise first ridges extending across the first cover in a first direction and second ridges extending across the cover in a second direction transverse to the first direction.

22. The packaged device of claim 14 wherein:
the first casing has interconnect elements defined by first ridges extending across a first side for the first casing and second ridges extending across a second side of the first casing;
the second casing has mating elements that receive the first ridges of the first casing; and
the receiving members of the heat sink include channels that receive the second ridges of the first casing.

23. The packaged device of claim 14, wherein the die includes integrated circuitry forming a high-speed microelectronic device capable of operating at more than 500 Mhz.

* * * * *